United States Patent [19]

Hoffmann

[11] 4,441,171
[45] Apr. 3, 1984

[54] MONOLITHICALLY INTEGRATED SEMICONDUCTOR MEMORY

[75] Inventor: Kurt Hoffmann, Taufkirchen, Fed. Rep. of Germany

[73] Assignee: Siemens Aktiengesellschaft, Berlin and Munich, Fed. Rep. of Germany

[21] Appl. No.: 339,156

[22] Filed: Jan. 13, 1982

[30] Foreign Application Priority Data

Jan. 19, 1981 [DE] Fed. Rep. of Germany ....... 3101520

[51] Int. Cl.$^3$ .................... G11C 11/24; G11C 7/00
[52] U.S. Cl. .................... 365/205; 365/149; 307/355
[58] Field of Search .............. 365/149, 154, 190, 202, 365/203, 205, 210; 307/355, 530

[56] References Cited

U.S. PATENT DOCUMENTS 4,169,233 9/1979 Haraszti ................ 365/205 X
4,255,679 3/1981 White, Jr. et al. ............ 365/205 X

*Primary Examiner*—Joseph A. Popek
*Attorney, Agent, or Firm*—Herbert L. Lerner; Laurence A. Greenberg

[57] ABSTRACT

Monolithically integrated semiconductor memory, including a matrix of identical memory cells disposed in a set of row members and a set of column members, each of the memory cells including a single MOS-field effect transistor and a storage capacitor, a comparator, and a comparison cell, the comparison cell being in the form of a memory cell including a single MOS-field effect transistor and a storage capacitor, the comparator and the comparison cell being assigned to each of the members of one of the sets, each of the comparators within the matrix of single-transistor memory cells including a flip-flop memory cell constructed in complimentary MOS-technology.

6 Claims, 3 Drawing Figures

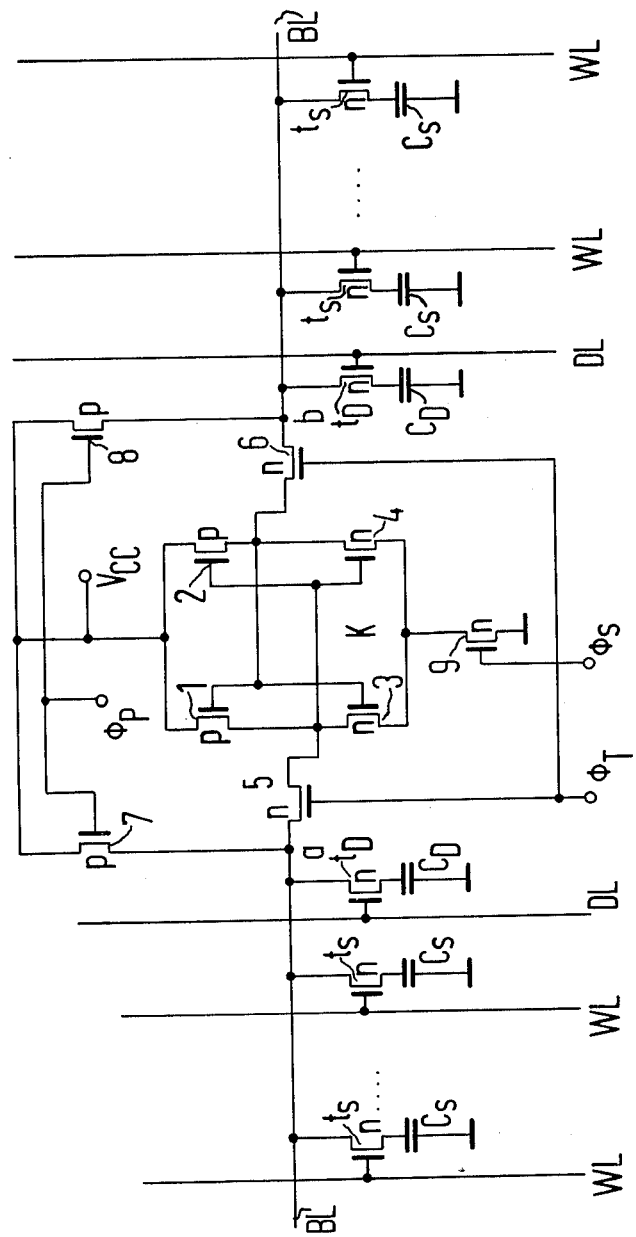

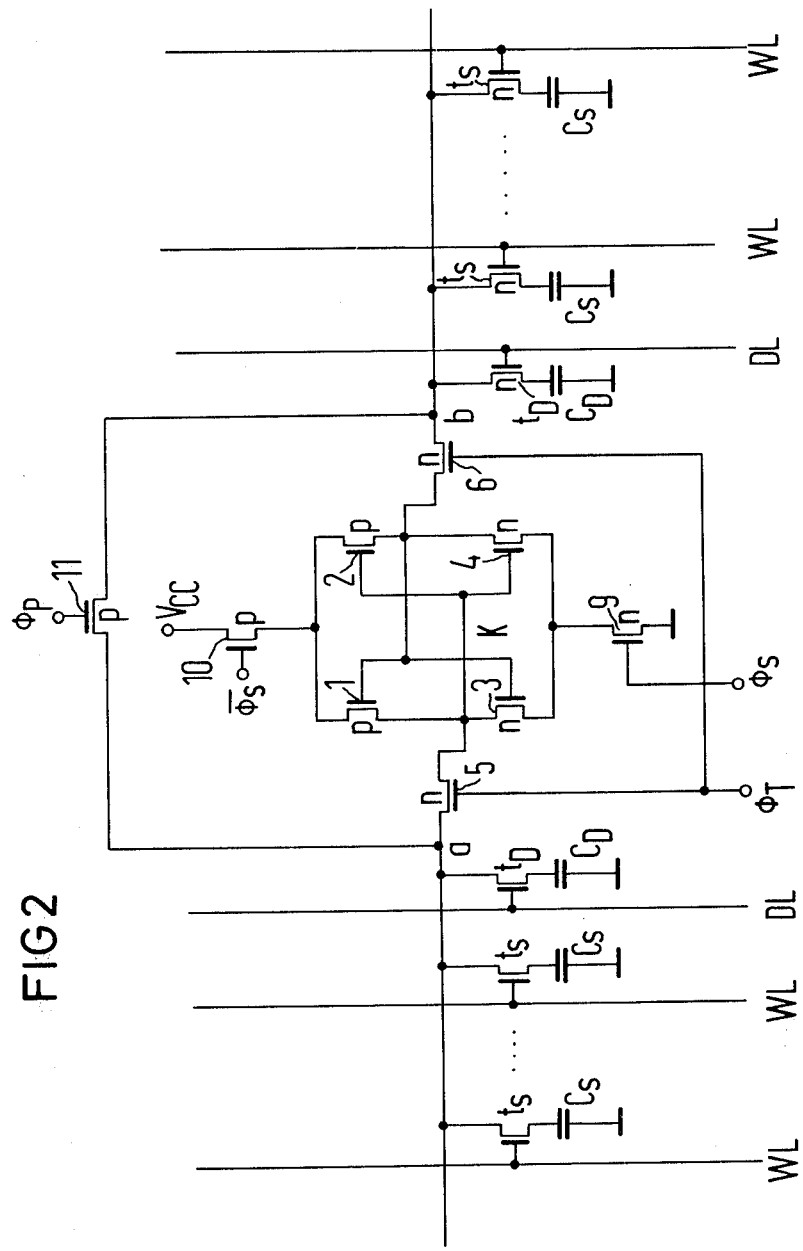

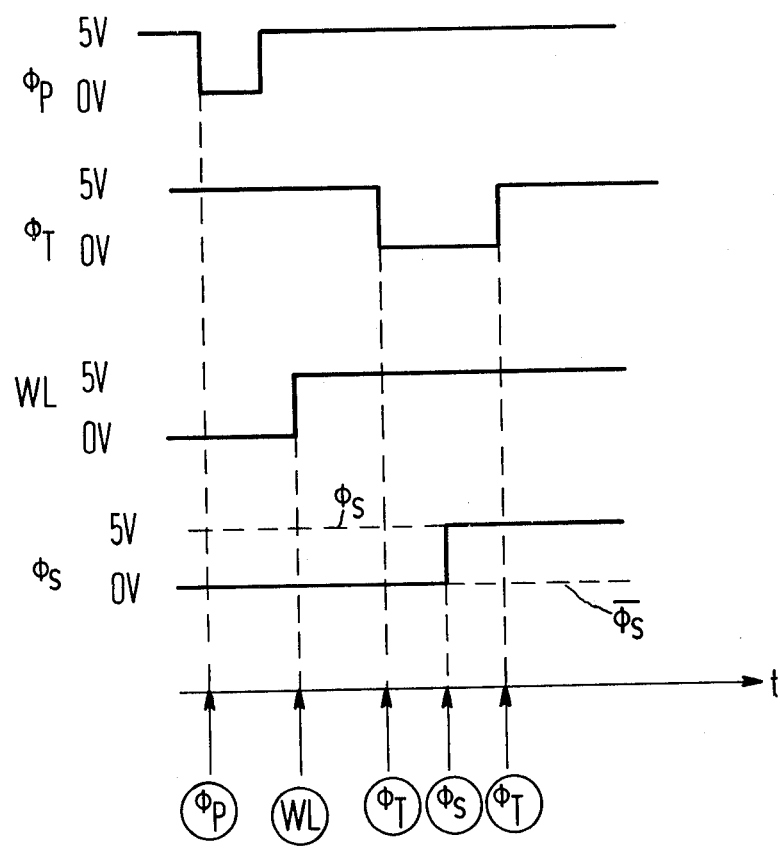

MONOLITHICALLY INTEGRATED SEMICONDUCTOR MEMORY

BACKGROUND OF THE INVENTION

1. Field of the Invention

The invention relates to a monolithically integrated semiconductor memory with a matrix of identical memory cells arranged in rows of a set of row members and in columns or a set of column members, each in the form of an MOS-field effect transistor of the enhancement type and a storage capacity represented by an MOS-capacitor, wherein one comparator each and a comparison cell which is likewise represented by a memory cell of the above-mentioned type, is assigned to either each matrix column or each matrix row.

2. Description of the Prior Art

In the customary organization of such dynamic RAM-memories, assigned to each column of the memory matrix is one comparator which is effective as a differential amplifier, is located in the middle of the respective column, and is represented by a bistable flip-flop. One half of all the single-transistor memory cells provided per column is connected with its drain terminals to one input and the other half is connected in the same manner to the other input of the comparator. In each column there are furthermore provided two comparison cells, i.e. so-called dummy cells which are each connected to one of the two inputs of the associated comparator in the same manner as the memory cells proper. If, as customary, the usual designation "word line" is used for the line which is assigned to the respective individual matrix rows and is connected to the gate electrodes of the one-transistor memory cells belonging to the respective matrix row, and is arranged parallel to the rows, and the usual designation "bit line" is used for the line which is assigned to the individual matrix columns and is arranged parallel thereto, then the situation can be defined as follows: Each bit line BL of the memory matrix is cut in half and one half is connected to one signal input and the other half is connected to the other signal input of the respective corresponding comparator K. The number of single-transistor memory cells provided per column is accordingly also cut in half, one half being connected to one signal input and the other half to the other signal input of the comparator K, as can also be seen from FIG. 1 of the instant application yet to be described. The voltage-carrying terminal of the MOS-transistor of the individual single-transistor memory cell, facing away from the respective bit line BL, is connected through the storage capacitor of the respective cell to the reference potential (ground) or instead, to the other supply potential ($V_{CC}$).

Such a memory circuit is shown, for instance, in the publication "1978 IEEE International Solid-State Circuits Conference", Pages 156 and 157 (see, for instance, FIG. 1 of this reference).

In the known memories with single-transistor memory cells, the comparator K is constructed as a rule of transistors of the same type as is used for the transistors of the single-transistor memory cells. The comparator K can therefore be jointly fabricated without an additional doping effort with the other transistors of the memory.

On the other hand, so-called CMOS-memories are known (see Proc. IEEE (July 1971), Pages 1044–1058; particularly Page 1054, FIG. 17) which use so-called six-transistor cells as memory cells. These memory cells are each composed of two inverters provided in CMOS-technology which in turn are formed of a series circuit of a p-channel transistor and an n-channel transistor (both of the enhancement type). The gates of these two complementary MOS-transistors of the individual inverter together form the signal input of the inverter, while its signal output is represented by a circuit point between the series-connected source-drain paths of the two transistors of the inverter. The two inverters are now connected, for instance, with the other terminal of their source-drain path to one pole, such as the positive pole of a d-c voltage source and there they receive the potential $V_{CC}$, while the second terminal of the source-drain path of the respective second transistor, such as the n-channel transistor of the two inverters, is therefore connected to the other pole, such as the negative pole of the d-c voltage source. Finally, the two gates of the first inverter are connected to the signal output of the second inverter and the two gates of the second inverter of the memory cell are connected to the signal output of the first inverter, whereby the desired flip-flop effect and therefore, the storage ability of the cell, is secured. In conclusion it should further be noted that the terminals of the cell given by the outputs of the two inverters are each connected through the source-drain path of one n-channel MOS-field effect transistor of the enhancement type each, to one bit line controlling the respective flip-flop storage cell each, while the gates of these two field effect transistors are controlled through the word line assigned to the respective storage cell.

SUMMARY OF THE INVENTION

It is accordingly an object of the invention to provide a monolithically integrated semiconductor memory, which overcomes the hereinafore-mentioned disadvantages of the heretofore-known devices of this general type, and to improve the dynamic matrix memory constructed on the basis of single-transistor memory cells, with respect to the sensitivity of response, through increasing the efficiency of its comparators.

With the foregoing and other objects in view there is provided, in accordance with the invention, a monolithically integrated semiconductor memory, comprising a matrix of identical memory cells disposed in a set of row members and a set of column members, each of the memory cells including a single MOS-field effect transistor and a storage capacitor, such as an MOS-capacitor, a comparator, and a comparison cell, the comparison cell likewise being in the form of a memory cell including a single MOS-field effect transistor and a storage capacitor, the comparator and the comparison cell being assigned to each of the members of one of the sets, each of the comparators within the matrix of single-transistor memory cells including a flip-flop memory cell constructed in complementary MOS-technology.

The replacement of the flip-flops which are customarily used as comparators and are equipped exclusively with transistors of the type of the transistors used in the single-transistor memory cells, by a comparator constructed in complementary MOS-technology, obviously requires an increase of the technical effort provided in the manufacture of the memory matrix. The increased effort, however, is more than compensated by the advantage obtained with respect to increased operating speed. It is furthermore not an insignificant fact that such a comparator requires no greater space, as compared to the customary comparators. The main point, however, is that the response sensitivity, and therefore the response speed, is increased substantially through the use of such a comparator, as compared to the customary standard RAM's with single-transistor memory cells.

In accordance with another feature of the invention, the comparator includes at least six MOS-field effect transistors being partly of the n-channel type and partly of the p-channel type, and including matrix lines connected to the single-transistor memory cells assigned to at least one of the comparator and/or comparison cells, two of the transistors of the comparator having the same channel type and being connected to the flip-flop cell proper of the comparator and to the matrix lines, two supply terminals of the flip-flop cell supplying current to the comparator, and means connected to the gates of the two transistors of the comparator for jointly controlling the two transistors of the comparator with a clock signal.

In accordance with a further feature of the invention, another two of the transistors of the comparator are included in the flip-flop cell and have the same channel type, and there is provided a seventh MOS-field effect transistor being immediately connected to and having the same channel type as the other two transistors of the comparator and having a source-drain path connected between reference potential and the flip-flop, and means connected to the gate of the seventh transistor for controlling the seventh transistor with another clock signal.

In accordance with an added feature of the invention, there is provided at least one further MOS-field effect transistor having a source-drain path, two external terminals disposed at the connection of the matrix lines through the flip-flop of the comparator, the terminals being connected through the source-drain path of the at least one further transistor to the connection through the flip-flop, and means connected to the gate of the at least one further transistor for controlling the at least one further transistor with an addition clock signal.

In accordance with an additional feature of the invention, one of the supply potentials is connected to two of the six transistors of the flip-flop of the comparator, and the at least one further transistor connected to the external comparator terminals is in the form of two transistors having the same channel type as the other two transistors connected to reference potential through the seventh transistor, or the same channel type as the two transistors of the flip-flop of the comparator connected to the one supply terminal.

In accordance with again another feature of the invention, the transistors of the single-transistor memory cells are of the n-channel type, the other two transistors connected to reference potential through the seventh switching transistor as well as the seventh transistor are of the n-channel type, and besides the transistors of the same channel type connected between the matrix lines and the flip flop, the balance of the transistors of the comparator and the at least one further transistor are of the p-channel type.

In accordance with a concomitant feature of the invention, there is provided a clock-controlled MOS-field effect transistor connected between the one supply potential and the flip-flop of the comparator having the same channel type as the two transistors connected to the one supply potential, and means connected to the gate of the clock-controlled transistor for controlling the clock-controlled transistor with a clock signal being inverted relative to the other clock signal.

Other features which are considered as characteristic for the invention are set forth in the appended claims.

Although the invention is illustrated and described herein as embodied in a monolithically integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection of the accompanying drawings, in which:

BRIEF DESCRIPTION OF THE DRAWING

FIGS. 1 and 2 are circuit diagrams of two preferred embodiments of the monolithically integrated semiconductor memory according to the invention; and FIG. 3 is a timing diagram corresponding to the illustrated embodiments.

DESCRIPTION OF THE PREFERRED EMBODIMENTS

Referring now to the drawing and first, particularly, to FIGS. 1 and 2, there are shown therein single-transistor memory cells formed, as indicated hereinbefore, of a transfer transistor $t_s$, the drain of which is connected to reference potential via a storage capacitor $C_s$ associated with the respective storage cell, whereas the source terminal thereof is connected to a bit line BL associated with the respective matrix column and consequently to the respective storage cell. Conventionally, the charging or transfer transistors $T_s$ are also formed here of identical n-channel MOS-FET's of the enhancement type and are consequently self-blocking. The latter statement also supplies, incidentally, to all field effect transistors used in the memory matrix, including the comparators K.

As usual, the number of the memory cells assigned to the individual matrix column is also here cut in half, so that one half of these memory cells $t_s$, $C_s$ is connected, via one half of the respective associated bit line BL, to the information-carrying terminal a, and the other half of these memory cells, via the other half of the bit line BL, to the other information-carrying terminal b of the comparator K. The gates of the single-transistor storage cells associated with the respective individual matrix i.e. the transistors $t_s$ thereof, are connected to a respective common word line WL and are addressed via the latter. For obvious reasons, the work line WL, in contrast with the bit lines BL, are not cut in half.

In addition, each half of the bit lines BL is provided with a respective comparison cell or dummy cell $t_D$, $C_D$ identical with the individual single-transistor memory cells $t_s$, $C_s$, and which is connected to the corresponding bit line half BL in a manner similar to the memory cells proper. Thus, such a comparison cell $t_D$, $C_D$ is connected, respectively, to each of the two information-carrying terminals a and b of the provided comparators K. The comparison cells connected to the terminal a of the comparators K are addressable via a first dummy line DL corresponding to the word lines in the memory cells $t_s$, $C_s$ proper, and the comparison cells connected to the terminals b of the comparators K are addressable by an analogous second dummy line DL.

From the two information-carrying terminals a and b of the individual comparators K, one current-carrying terminal of the source-drain path, respectively, of an n-channel field effect transistor 5 or 6, respectively, leads into the interior of the comparator K. The other current-carrying terminal of these two n-channel transistors 5 and 6 is connected, respectively, to the output of a CMOS-inverter 1, 3 and to the input of a CMOS-inverter 2, 4, on the one hand, and to the output of the CMOS-inverter 2, 4 and the input of the CMOS-inverter 1, 3 on the other hand. It should be mentioned that the two MOS-field effect transistors 5 and 6 are controlled by a common clock signal $\phi_T$ and may also be realized, if desired or necessary, as p-channel MOS-field effect transistors.

The two inverters 1, 3 and 2, 4 correspond, in construction, to conventional CMOS-memory cells, the two transistors 1 and 2 being of the p-channel type and the two transistors 3 and 4 of the n-channel type, in the case of the illustrated embodiments. Both transistors 1 and 2, on the one hand, and both transistors 3 and 4, on the other hand, are, respectively, connected to one another via the source terminals and are addressed via the latter by a respective one of the two supply potentials $V_{cc}$ provided for the circuit and the reference potential (ground), respectively. Furthermore, the drains of the two transistors 1 and 3, on the one hand, are connected via the n-channel transistor 5 to the information-carrying terminal a, and the drains of the two transistors 2 and 4, on the other hand, are connected via the n-channel transistor 6 to the information-carrying terminal b of the comparator K. Finally, to attain the flip-flop effect, cross coupling is provided by connecting the drains of the transistors 2 and 4 to the gates of the transistors 1 and 3, as well as connecting the drains of the transistors 1 and 3 to the gates of the transistors 2 and 4.

Common to the two embodiments according to FIG. 1 and FIG. 2, is that between the supply terminal supplying the reference potential i.e. the source terminals of the two n-channel transistors 3 and 4 of the comparator K, the source-drain path of a further n-channel MOS-field effect transistor 9 is connected, the latter is controlled by a further clock signal $\phi_s$.

As far as described hereto, the two circuits according to FIG. 1 and FIG. 2 are in agreement. However, there are deviations with respect to a further connection extending outside of the flip-flop 1, 2, 3, 4 between the two information-carrying terminals a and b of the comparator K as well as with respect to the connection of the flip-flop to the first supply potential $V_{CC}$.

In the case of the embodiment according to FIG. 1, the two information-carrying terminals a and b of the comparator K are mutually connected via the series connection of two p-channel MOS-field effect transistors 7 and 8. The gates of these two transistors 7 and 8 are controlled jointly by a third clock signal $\phi_P$. In addition, the supply terminal supplying the first supply potential $V_{CC}$ is connected both to the source terminals of the two p-channel transistors 1 and 2 of the flip-flop of the comparator K as well as also to a circuit point between the source-drain paths of the two series-connected p-channel transistors 7 and 8, as can be seen from FIG. 1.

Due to the circuit shown in FIG. 1, the bit lines BL are obviously precharged to the $V_{CC}$ potential. On the other hand, however, an embodiment may be of interest wherein the bit lines are precharged to the potential $\frac{1}{2} \cdot V_{CC}$.

The latter is the case in the circuit shown in FIG. 2. In the embodiment shown in FIG. 2, contrary to that of FIG. 1, there is provided in the connection between the two information-carrying terminals a and b of the comparator K, only a single MOS-FET 11, which is likewise of the p-channel type and is controlled by a clock signal $\phi_P$ which corresponds to the clock signal $\phi_P$ to be used for controlling the p-channel transistors 7 and 8 in the circuit according to FIG. 1. In addition, in the embodiment according to FIG. 2, the first supply potential $V_{CC}$ is also not connected directly to the flip-flop 1, 2, 3 and 4 forming the comparator K. Rather, deviating from FIG. 1, a switching transistor 10 corresponding to the switching transistor 9 is provided here also, but, however, contrary to the switching transistor 9, it is of the p-channel type and is controlled by a clock signal which is inverted as compared to the clock signal $\phi_s$ controlling the transistor 9 and therefore is designated $\bar{\phi}_s$.

The timing diagram for the clock control of the comparator K is shown in FIG. 3. The pulses $\phi_s$, $\phi_T$, $\phi_P$ and WL are clock pulses which are also used for the operation of conventional dynamic RAM-memories. There as well as here, the pulse train $\phi_s$ serves for activating the comparator K and the pulse train $\phi_T$ for separating and connecting, respectively, the bit lines BL to the comparator K, the pulse train $\phi_P$ serves for precharging the bit lines BL, and the pulse train WL serves for addressing the word lines. The signal $\bar{\phi}_s$, which is provided for controlling the switching transistor 10 and is inverted relative to the signal $\phi_s$ in the circuit according to FIG. 2, It should be noted that the two switching transistors 9 and 10 can be assigned simultaneously to several comparators K and, consequently, matrix columns, so that, also in this respect, a simplification and consequent conservation of space are possible. It should further be noted that, in a device according to the invention, the storage cells $t_s$, $C_s$ provided per column, in their entirety, can also merely be connected to the same input of the comparator K, such as to the input a, for example, so that only the dummy cell assigned to or associated with the respective column is connected to the other input b.

Finally, modifications of the comparators K with respect to the connection to the supply potential are also possible, which an individual skilled in the art will readily recognize.

The foregoing is a description corresponding to German Application No. P 31 01 520.4, dated Jan. 19, 1981, International priority of which is being claimed for the instant application, and which is hereby made part of this application. Any discrepancies between the foregoing specification and the aforementioned corresponding German application are to be resolved in favor of the latter.

I claim:

1. Monolithically integrated semiconductor memory, comprising:
 a reference potential source, a supply potential source, a matrix of identical one-transistor memory cells disposed in a set of row members and a set of column members, identical comparators constructed in CMOS technology, and comparison cells, one of said comparators and one of said comparison cells being assigned to each of said members of one of said sets;

said comparators each including: a first MOS-field effect transistor of a given first channel conductivity type having a gate electrode controlled by a first clock signal, a first current-carrying terminal connected to said reference potential source, and a second current-carrying terminal, a flip-flop formed of first and second pairs of MOS-field effect transistors each having current-carrying terminals, said transistors of one of said pairs being of the n-channel type and said transistors of the other of said pairs being of the p-channel type, said first pair of transistors having said given channel conductivity type of said first transistor, one of said current-carrying terminals of each of said transistors of said first pair forming a first supply terminal connected to said second current-carrying terminal of said first transistor for receiving reference potential from said reference potential source, one of said current-carrying terminals of each of said transistors of said second pair forming a second supply terminal directly connected to said supply potential source, two second MOS-field effect transistors of a channel conductivity type opposite said given type, each of said second MOS-field effect transistors having gate electrodes controlled by a common second clock signal, first current-carrying terminals connected to said second supply terminal and second current-carrying terminals, two third MOS-field effect transistors each having a gate electrode controlled by a common third clock signal, a first current-carrying terminal connected to a respective one of said second current-carrying terminals of said second transistors, and a second current-carrying terminal, and two terminals of said flip-flop for receiving information each being connected to a respective one of said second current-carrying terminals of said third transistors;

said one-transistor memory cells and said comparison cells being connected to said first current-carrying terminals of said third transistors for acting on said comparators.

2. Monolithically integrated semiconductor memory, comprising:

a reference potential source, a supply potential source, a matrix of identical one-transistor memory cells disposed in a set of row members and a set of column members, identical comparators constructed in CMOS technology, and comparison cells, one of said comparators and one of said comparison cells being assigned to each of said members of one of said sets;

said comparators each including: a first MOS-field effect transistor of a given first channel type having a gate electrode controlled by a first clock signal, a first current-carrying terminal connected to said reference potential source, and a second current-carrying terminal, a flip-flop formed of first and second pairs of MOS-field effect transistors each having current-carrying terminals, said transistors of one of said pairs being of the n-channel type and said transistors of the other of said pairs being of the p-channel type, said first pair of transistors having said given channel conductivity type of said first transistor, one of said current-carrying terminals of each of said transistors of said first pair forming a first supply terminal connected to said second current-carrying terminal of said first transistor for receiving reference potential from said reference potential source, one of said current-carrying terminals of each of said transistors of said second pair forming a second supply terminal to be acted upon by said supply potential source, a second transistor of a conductivity type opposite said given type having a gate electrode controlled by a second clock signal, and a source-drain path connected between said second supply terminal and said second supply potential source, two third MOS-field effect transistors each having a gate electrode controlled by a common third clock signal, and a source-drain path, a fourth MOS-field effect transistor having a gate electrode controlled by a fourth clock signal and two current-carrying terminals, and two information terminals of said flip-flop, each of said information terminals being connected through a respective one of said source-drain paths of said third transistors to a respective one of said current-carrying terminals of said fourth transistor and to said one-transistor memory cells for acting on said information terminals.

3. Semiconductor memory according to claim 1 or 2, wherein said first transistor is of the n-channel type.

4. Semiconductor memory according to claim 1 or 2, wherein said one-transistor memory cells and comparison cells include MOS-field effect transistors of the n-channel type.

5. Semiconductor memory according to claim 1 or 2, wherein said third transistors are of the n-channel type.

6. Semiconductor memory according to claim 2, wherein said fourth transistor is of the p-channel type.

* * * * *